United States Patent
Vermersch et al.

(10) Patent No.: US 9,108,881 B2
(45) Date of Patent: Aug. 18, 2015

(54) GLASS SUBSTRATE COATED WITH A HIGH-INDEX LAYER UNDER AN ELECTRODE COATING, AND ORGANIC LIGHT-EMITTING DEVICE COMPRISING SUCH A SUBSTRATE

(75) Inventors: François-Julien Vermersch, Paris (FR); Sylvie Abensour, Montlignon (FR); Jean-Luc Allano, Deuil la Barre (FR); Marie-Virginie Ehrensperger, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 24 days.

(21) Appl. No.: 13/574,549

(22) PCT Filed: Jan. 12, 2011

(86) PCT No.: PCT/FR2011/050052
§ 371 (c)(1),
(2), (4) Date: Aug. 22, 2012

(87) PCT Pub. No.: WO2011/089343
PCT Pub. Date: Jul. 28, 2011

(65) Prior Publication Data
US 2012/0313134 A1    Dec. 13, 2012

(30) Foreign Application Priority Data
Jan. 22, 2010  (FR) ..................... 10 50420

(51) Int. Cl.
*H01L 29/76*  (2006.01)
*C03C 17/36*  (2006.01)
(Continued)

(52) U.S. Cl.
CPC .............. *C03C 17/3671* (2013.01); *C03C 8/04* (2013.01); *C03C 17/3411* (2013.01);
(Continued)

(58) Field of Classification Search
CPC ........................ H01L 51/5262; H01L 51/5268
USPC ................................................... 257/E21.003
See application file for complete search history.

(56) References Cited

U.S. PATENT DOCUMENTS

| | | | |
|---|---|---|---|
| 4,649,432 A | 3/1987 | Watanabe et al. | |
| 5,252,521 A | 10/1993 | Roberts | |

(Continued)

FOREIGN PATENT DOCUMENTS

| | | |
|---|---|---|
| DE | 197 33 053 | 2/1999 |
| DE | 20 2005 000 979 | 7/2006 |

(Continued)

OTHER PUBLICATIONS

Kloeppel, A., et al., "Dependence of the electrical and optical behaviour of ITO-silver-ITO multilayers on the silver properties", Thin Solid Films, Elsevier, vol. 365, No. 1, pp. 139-146, Apr. 1, 2000.
(Continued)

*Primary Examiner* — Michael Shingleton
(74) *Attorney, Agent, or Firm* — Pillsbury Winthrop Shaw Pittman LLP (57) ABSTRACT

A glass substrate including a first face and a second face opposing the first face, the substrate including, above the second face, an electrode layer which includes at least one electrically conducting layer, wherein the substrate includes, between the second face and the electrode layer, at least one layer of vitreous material having an index in the range from 1.7 to 2.4 and including from 40% to 60% by weight of bismuth oxide $Bi_2O_3$ and from 5% to 30% by weight of ZnO.

21 Claims, 1 Drawing Sheet

(51) Int. Cl.
  *C03C 8/04* (2006.01)
  *C03C 17/34* (2006.01)
  *H01L 51/52* (2006.01)

(52) U.S. Cl.
  CPC ............ *C03C 17/3423* (2013.01); *C03C 17/36* (2013.01); *C03C 17/3618* (2013.01); *H01L 51/5262* (2013.01); *C03C 2217/425* (2013.01); *C03C 2217/452* (2013.01); *C03C 2217/48* (2013.01); *C03C 2217/78* (2013.01); *H01L 51/5268* (2013.01)

(56) References Cited

U.S. PATENT DOCUMENTS

| | | |
|---|---|---|
| 5,280,373 A | 1/1994 | Ozawa et al. |
| 5,326,591 A | 7/1994 | Roberts |
| 5,346,770 A | 9/1994 | Osada et al. |
| 5,667,853 A | 9/1997 | Fukuyoshi et al. |
| 5,962,115 A | 10/1999 | Zmelty et al. |
| 6,014,196 A | 1/2000 | Anzaki et al. |
| 6,040,056 A | 3/2000 | Anzaki et al. |
| 6,045,896 A | 4/2000 | Boire et al. |
| 6,414,431 B1 | 7/2002 | Yu et al. |
| 6,489,045 B1 | 12/2002 | Araki et al. |
| 7,049,757 B2 | 5/2006 | Foust et al. |
| 7,161,171 B2 | 1/2007 | Dahmani et al. |
| 2002/0008286 A1 | 1/2002 | Yamazaki et al. |
| 2003/0049464 A1 | 3/2003 | Glenn et al. |
| 2003/0162333 A1 | 8/2003 | Kim et al. |
| 2003/0186064 A1 | 10/2003 | Murata et al. |
| 2004/0001915 A1 | 1/2004 | He et al. |
| 2004/0031957 A1 | 2/2004 | Tyan |
| 2004/0032220 A1 | 2/2004 | Cok et al. |
| 2004/0081855 A1 | 4/2004 | Kim et al. |
| 2004/0113146 A1 | 6/2004 | Dahmani et al. |
| 2004/0149984 A1 | 8/2004 | Tyan et al. |
| 2004/0227462 A1 | 11/2004 | Utsumi et al. |
| 2004/0245918 A1 | 12/2004 | Lee |
| 2005/0000564 A1 | 1/2005 | Sato et al. |
| 2005/0073228 A1 | 4/2005 | Tyan et al. |
| 2005/0073251 A1 | 4/2005 | Kato |
| 2005/0124257 A1 | 6/2005 | Maeuser |
| 2005/0162071 A1 | 7/2005 | Lee et al. |
| 2005/0199904 A1 | 9/2005 | Yamamoto |
| 2005/0264185 A1 | 12/2005 | Hoffmann |
| 2006/0043886 A1 | 3/2006 | Lee et al. |
| 2006/0091791 A1 | 5/2006 | Shin |
| 2006/0097630 A1 | 5/2006 | Shiokawa et al. |
| 2006/0124933 A1 | 6/2006 | Kang |
| 2006/0152833 A1 | 7/2006 | Halls et al. |
| 2006/0209551 A1 | 9/2006 | Schwenke et al. |
| 2006/0269786 A1 | 11/2006 | Shin et al. |
| 2006/0290841 A1 | 12/2006 | Kwon et al. |
| 2007/0206263 A1 | 9/2007 | Neuman et al. |
| 2008/0100202 A1 | 5/2008 | Cok |
| 2009/0153972 A1 | 6/2009 | Nakamura et al. |
| 2010/0072884 A1 | 3/2010 | Tchakarov et al. |
| 2010/0117523 A1 | 5/2010 | Tchakarov |
| 2010/0225227 A1 | 9/2010 | Tchakarov et al. |

FOREIGN PATENT DOCUMENTS

| | | |
|---|---|---|
| EP | 0 733 931 | 9/1996 |
| EP | 0 747 330 | 12/1996 |
| EP | 0 847 965 | 6/1998 |
| EP | 1 100 129 | 5/2001 |
| EP | 1 329 307 | 7/2003 |
| EP | 1 396 676 | 3/2004 |
| EP | 1 403 939 | 3/2004 |
| EP | 1 435 762 A1 | 7/2004 |
| EP | 1 521 305 | 4/2005 |
| EP | 1 693 483 | 8/2006 |
| EP | 1 717 876 | 11/2006 |
| EP | 2 178 343 A1 | 4/2010 |
| FR | 2 844 136 | 3/2004 |
| JP | 10-100303 | 4/1998 |
| JP | 10-217378 | 8/1998 |
| JP | 11-070610 | 3/1999 |
| JP | 2001-243840 | 9/2001 |
| JP | 2002-015623 | 1/2002 |
| JP | 2002-313139 | 10/2002 |
| JP | 2002-313572 | 10/2002 |
| JP | 2005-038681 A | 2/2005 |
| JP | 2006-139932 A | 6/2006 |
| WO | WO 99/02017 | 1/1999 |
| WO | 03/026357 A1 | 3/2003 |
| WO | WO 2004/057674 | 7/2004 |
| WO | WO 2005/041620 | 5/2005 |
| WO | WO 2005/053053 | 6/2005 |
| WO | WO 2005/081334 | 9/2005 |
| WO | WO 2006/013373 | 2/2006 |
| WO | WO 2007/096565 | 8/2007 |
| WO | WO 2008/029060 | 3/2008 |
| WO | 2009/017035 A1 | 2/2009 |
| WO | WO 2010/084922 | 7/2010 |
| WO | WO 2010/084925 | 7/2010 |

OTHER PUBLICATIONS

Jung, Yeon Sik, et al., "Effects of thermal treatment on the electrical and optical properties of silver-based indium tin oxide / metal / indium tin oxide structures", Thin Solid Films, Elsevier, vol. 440, No. 1-2, pp. 278-284, Sep. 1, 2003.

International Search Report as issued for International Application No. PCT/FR2011/050052, dated May 16, 2011.

Notice of Reasons for Rejection issued in Japanese Patent Application No. JP 2012-549395, dated Oct. 14, 2014.

GLASS SUBSTRATE COATED WITH A HIGH-INDEX LAYER UNDER AN ELECTRODE COATING, AND ORGANIC LIGHT-EMITTING DEVICE COMPRISING SUCH A SUBSTRATE

CROSS-REFERENCE TO RELATED APPLICATIONS

This application is the U.S. National Stage of PCT/FR2011/050052, filed Jan. 12, 2011, which in turn claims priority to French Application No. 1050420, filed Jan. 22, 2010. The content of these applications are incorporated herein by reference in their entirety.

The present invention relates to a glass substrate having an electrode on one of its faces.

It relates more particularly to a glass substrate for a structure used as a support medium for a device with an organic light-emitting diode, referred to as OLED.

An OLED comprises a material, or a stack of materials, being organic light-emitting, and is enclosed between two electrodes, one of the electrodes, referred to as lower electrode, generally the anode, being formed by that associated with the glass substrate and the other electrode, referred to as upper, generally the cathode, being arranged on the organic light-emitting system.

An OLED is a device that emits light by electroluminescence using the energy of recombination of holes injected from the anode and of electrons injected from the cathode.

Various configurations of OLED exist:
  the devices using bottom emission, in other words with a lower (semi-) transparent electrode and an upper reflecting electrode;
  the devices using top emission, in other words with an upper (semi-) transparent electrode and a lower reflecting electrode;
  the devices using top and bottom emission, in other words with both a lower (semi-) transparent electrode and an upper (semi-) transparent electrode.

The invention relates to OLED devices using bottom emission and potentially also using top emission.

An OLED is generally applicable in a display screen or a lighting device with different constraints.

For a general lighting system, the light extracted from the OLED is a "white" light emitting in certain or even all wavelengths of the spectrum. It must furthermore be emitted in a uniform manner. In this respect, the emission is more precisely said to be Lambertien, in other words obeying the Lambert law being characterized by an equal photometric radiation in all directions.

Furthermore, an OLED exhibits a low efficiency for extraction of light: the ratio between the light that effectively exits from the glass substrate and that emitted by the light-emitting materials is relatively low, of the order of 0.25.

This phenomenon is, on the one hand, explained by the fact that a certain quantity of photons remain trapped in guided modes between the electrodes and, on the other hand, by the reflection of the light within the glass substrate owing to the difference in index between the glass of the substrate (n of around 1.5) and the air outside the device (n=1).

Solutions are therefore sought for improving the efficiency of an OLED, namely by increasing the extraction gain while at the same time supplying a light which is 'white', in other words emitting in certain, or even all, wavelengths of the visible spectrum.

The solutions usually put forward relate to the glass substrate, either at the glass-air interface, where solutions are referred to as geometric optics solutions since they most often make use of geometric optics, or at the glass-lower electrode interface, where solutions are referred to as diffractive optics solutions since they usually make use of diffractive optics.

A known solution of the diffractive optics type provides the glass-lower electrode interface with a structure having periodic protrusions forming a diffraction grating. The U.S. patent application No. US 2004/0227462 shows a diffractive optics solution. For this purpose, this document discloses an OLED whose transparent substrate, support medium for the lower electrode and for the organic layer, is textured. The surface of the substrate thus has an alternation of peaks and troughs whose profile is followed by the lower electrode and the organic layer deposited on top.

However, although such a solution is efficient for the extraction of monochromatic light, in other words in a given direction of space, its performance is not as good for polychromatic light such as white light for a lighting application.

Furthermore, in this document US 2004/0227462, the profile of the substrate is obtained by applying a photoresist mask onto the surface of the substrate whose pattern corresponds to that sought for the peaks and troughs, then by etching the surface through the mask. Such a process is not easy to implement on an industrial scale over large surface areas of substrate, and is above all very costly, especially for lighting applications.

International patent application No. WO 05/081334 divulges another diffractive optics solution which consists in covering a plane glass substrate with a textured polymer layer obtained by embossing, the lower electrode and the organic layer being subsequently deposited following the profile of the polymer layer. The undulations of the layer, which may be periodic or otherwise, are dimensioned such that the distance separating an undulation peak from a trough is in the range between 0.5 μm and 200 μm.

However, with such a solution, many electrical failures of OLEDs have however been observed.

The best current performance has been obtained with OLEDs deposited on high-index substrates. Indeed, by adjusting the index of the glass substrate, the distribution of the modes can be completely modified.

Indeed, in the case of a glass substrate with index 1.5, only around 50% of the photons will reach the substrate, the rest being trapped within the organic layers and the lower electrode.

By taking a substrate with an index matched with that of the anode and of the organic layer or layers (being around 1.8), modes previously trapped within the anode and/or the organic layer or layers can be extracted and around 80% of the photons can thus be made available.

However, the high-index substrates currently available are very costly and contain lead, which is a toxic element.

Another solution is presented in the U.S. patent application No. US 2009/0153972: in this document, a layer of vitreous material is provided on one face of a glass substrate, between this face and an electrode layer, this layer of vitreous material comprising diffusing elements, the distribution of these diffusing elements within the layer of vitreous material decreasing in the direction of the electrode layer.

Thus, the layer of vitreous material has an index that increases in the direction of the electrode layer.

However, the layer of vitreous material does not exhibit a sufficient chemical resistance with respect to the acid and base chemical etch reactions usually applied to the substrate coated with the electrode layer.

The aim of the invention is therefore to provide a substrate made of a mineral glass having a transparent electrode on one of its faces, the substrate being designed to form the support for an OLED device suitable for lighting, whose design is simple, reliable and allows the extraction of light emitted by said device to be improved with respect to the existing solutions, while at the same time being inexpensive to manufacture.

Another important goal is to allow such a substrate to be fabricated without any serious environmental limitations.

Another important goal is to allow such a substrate to be fabricated which is compatible with the deposition processes for the layers of the organic light-emitting system.

The present invention is based on the use of at least one particular layer made of a vitreous material having a high index (in other words an index greater than that of the substrate and which can be lower than, identical to or higher than that of the OLED) and which is disposed between the second face of the substrate and the adjacent electrode layer. This layer, although relatively thick, is however much thinner (by at least 10 to 100 times) than the substrate itself and is therefore less costly to fabricate than a specific substrate with a high index, while also exhibiting an improved chemical resistance, allowing the deposition onto the electrode layer of an organic light-emitting system on the industrial scale.

The present invention thus consists in its broadest sense of a substrate made of glass comprising a first face and a second face opposing the first, said substrate comprising, above its second face, an electrode layer which comprises at least one electrically conducting layer, characterized in that said substrate comprises, between its second face and the electrode layer, at least one layer of vitreous material having an index in the range between 1.7 and 2.4 including these values and comprising, on the one hand, between 40% and 60% by weight, including these values, or even between 45% and 58% by weight, including these values, of bismuth oxide $Bi_2O_3$ and, on the other hand, between 5% and 30% by weight, including these values, and preferably between 10 and 25% by weight, including these values, of ZnO.

The substrate thus has a low index, in the range between 1.4 and 1.6, and the vitreous material of the layer of vitreous material has a high index, higher than the low index of the substrate. This high index is lower than, equal to or higher than the generally high index of the source of emission of light and notably of an organic light-emitting system.

Throughout the description, the substrate according to the invention is considered to be positioned horizontally, with its first face oriented downward and its second face, opposing the first face, oriented upward; the directions of the expressions "above" and "below/under" are thus to be considered with respect to this orientation. In the absence of a specific stipulation, the expressions "above" and "below/under" do not necessarily mean that the two elements are disposed in contact with one another.

The terms "lower" and "upper" are used here with reference to this positioning.

Throughout the description, the term "index" makes reference to the optical index of refraction, measured at the wavelength of 590 nm.

The layer of vitreous material can be what those skilled in the art refer to as a vitreous enamel or frit.

Said layer of vitreous material preferably has a thickness in the range between 1 μm and 100 μm, or between 2 μm and 80 μm, or even between 5 μm and 60 μm.

The substrate according to the invention may comprise, between its second face and the electrode layer, several layers of vitreous material each having a different index, a layer of vitreous material disposed in the direction of said second face of the substrate having an index lower than that of another layer of vitreous material disposed in the direction of said electrode layer and said layers of vitreous material preferably all comprising, on the one hand, between 40% and 60% by weight, including these values, or even between 45% and 58% by weight, including these values, of bismuth oxide $Bi_2O_3$ and, on the other hand, between 5% and 30% by weight, including these values, and preferably between 10 and 25% by weight, including these values, of ZnO.

It is thus possible to produce a gradient of index with a progressive decrease of the index in two steps (two layers), or more, between the electrode layer and the low-index substrate and each layer of vitreous material preferably having an index in the range between 1.7 and 2.4.

However, it is possible for at least two layers of vitreous material not to have the same proportion of bismuth oxide $Bi_2O_3$ and/or not to have the same proportion of zinc oxide ZnO, whilst still remaining within the wide range hereinabove. It is thus possible, on the one hand, for a layer of vitreous material to comprise between 40% and 60% by weight, including these values, of bismuth oxide $Bi_2O_3$, and for another layer of vitreous material to comprise between 45% and 58% by weight, including these values, of bismuth oxide $Bi_2O_3$ and/or, on the other hand, for a layer of vitreous material to comprise between 5% and 30% by weight, including these values, of ZnO, and for another layer of vitreous material to comprise between 10 and 25% by weight, including these values, of ZnO.

According to one variant embodiment of the invention, at least one layer of vitreous material, and preferably each layer of vitreous material if there are several of them, comprises diffusing elements, in particular air bubbles and/or particles of a material with an index different from that of the layer of vitreous material, such as for example particles containing titanium oxide which will exhibit an index in the range 2.4 to 2.7, and/or crystals, such as for example crystals of zircon or baddeleyite.

Thus, according to this variant, said layer of vitreous material or at least one of said layers of vitreous material, or even all the layers of vitreous material is (or are) intrinsically diffusing layers.

According to another variant embodiment, at least one layer of vitreous material, and preferably each layer of vitreous material if there are several of them, comprises by weight:
- between 0% and 10% and preferably between 0 and 5% of $SiO_2$,
- between 0% and 5% and preferably between 0 and 1% of $Al_2O_3$,
- between 8% and 25% and preferably between 10 and 22% of $B_2O_3$,
- between 0% and 10% and preferably between 0 and 5% of CaO,
- between 0% and 20% and preferably between 0 and 15% of BaO,
- between 0% and 5% and preferably between 0 and 3% of $Li_2O$,
- between 0% and 10% and preferably between 0 and 5% of $Na_2O$,
- between 0% and 5% and preferably between 0 and 3% of $K_2O$,
- between 0% and 5% and preferably between 0 and 4% of $ZrO_2$,
- between 0% and 5% of SrO,
- between 0% and 5% of $La_2O_3$, including these values in the ranges.

According to another variant embodiment, said substrate comprises diffusing elements, in particular air bubbles and/or particles of a material with an index different from that of the layer of vitreous material, such as for example particles containing titanium oxide which will have an index of the in the range 2.4 to 2.7, and/or crystals, such as for example crystals of zircon or baddeleyite.

One face of the substrate or each face of the substrate (said first face and/or said second face of the substrate) may be a diffusing face and/or may be coated with a diffusing layer.

Thus, the interface between said layer of vitreous material and the substrate exhibit a morphology with characteristic scales such that the light is deflected (characteristic scales greater than 3 times the visible wavelengths, in such a manner that the laws of the geometric optics are applicable), or scattered (characteristic scales comparable with the visible wavelengths, such that wave optics is applicable). The visible light which is emitted by the organic material and propagates through the high-index vitreous material is thus transferred more efficiently into the substrate with a lower index.

The substrate may be rough, with a roughness defined by a roughness parameter Ra going from 1 to 5 μm, preferably going from 1 to 3 μm, over an analysis length of 15 mm, and with a Gaussian filter with cut-off frequency at 0.8 mm.

The roughness of the substrate is characterized by the well-known roughness parameter Ra which is the arithmetic mean deviation of the profile, corresponding to the mean amplitude. In order to define the rough substrate, the well-known roughness parameter RSm may be used as a complement, which is the mean value of the widths of the elements of the profile. The parameter RSm can thus go from 40 μm to 100 μm, or more preferably from 45 to 65 μm, over the analysis length of 15 mm, and with a Gaussian filter with cut-off frequency at 0.8 mm.

The roughness is obtained by a depolishing of a glass substrate, by means for example of hydrofluoric acid. One example of rough substrate is DecorFlou® glass produced by the company Omnidecor (silk texture).

Other types of glass that can be etched with acid may be chosen, such as for example:
SatenGlass® glass produced by the company Sevasa,
Satinovo® Mate glass produced by the company The Veneciana of Saint-Gobain,
Dekormat® glass produced by the company Dekormat Glass.

An optical profilometer is used for the roughness measurements, according to the principle of extended-field chromatic microscopy, for example by means of the MIM2 base station from the company STIL.

The measurement can be repeated 30 times with profile intervals of 1 mm.

The protrusions from the rough substrate are for example substantially pyramidal, distributed in a random fashion, diffusing the light isotropically.

The substrate according to the invention is designed, in particular, to comprise an organic light-emitting system above the electrode layer. This OLED device has a high index (or a mid-range index): it is equal to or higher than the index of the substrate itself.

The invention thus relates to structures of the type: low index·substrate/layer(s) of vitreous material with high index (ices)/electrode layer.

The visible light transmission of this substrate with this structure can be equal to or higher than 80%.

The present invention thus relates to a device with an organic light-emitting diode emitting polychromatic light comprising a substrate according to the invention, and the electrode layer forming one of the electrodes of the device.

The present invention also relates to the use of a substrate according to the invention as a support medium in a device with an organic light-emitting diode such as a lighting system, the electrode layer forming one of the electrodes of the device.

The present invention also relates to a method of fabrication of a glass substrate comprising a first face and an opposing second face, notably of a substrate according to the invention, said substrate comprising, above its second face, an electrode layer which comprises at least one electrically conducting layer, characterized in that at least one layer of vitreous material having an index in the range between 1.7 and 2.4, including these values, is deposited above said second face of said substrate prior to the deposition of said electrode layer, said layer of vitreous material comprising, on the one hand, between 40% and 60% by weight, including these values, or even between 45% and 58% by weight, including these values, of bismuth oxide $Bi_2O_3$ and, on the other hand, between 5% and 30% by weight, including these values, and preferably between 10 and 25% by weight, including these values, of ZnO, and said layer of vitreous material preferably being deposited from a frit, notably by silkscreen printing or by sputtering.

Advantageously, the proportion, on the one hand, of bismuth oxide in the layer of vitreous material (and preferably in each layer of vitreous material) and, on the other hand, of zinc oxide allows one (or several) layer(s) with high index(ices) and with an enhanced chemical resistance to be formed. This resistance is obtained by the combined action of these two oxides at least in their specific ranges.

In particular, this chemical resistance allows the substrate coated with the layer of vitreous material to be used in fabrication processes for electronic components and devices.

Indeed, the electronics industry uses in cleanrooms substrates which must withstand, in the first instance, manual or automated cleaning procedures in baths. These cleaning procedures must remove any trace of organic or mineral material, together with any trace of particles, from the substrates prior to the deposition of the organic light-emitting system. Each substrate therefore passes successively in contact with base and acid detergent solutions with intermediate rinsing stages between each step. The cleaning power is furthermore often enhanced by the presence of detergents and/or of ultrasound and/or by the use of a temperature close to around 40° C.

One example of a chain of baths will thus be composed of:
a first bath with a solution of de-ionized water with alkaline detergent designed to dissolve the organic materials deposited or condensed on the surface, then
a second bath for rinsing in hard water designed to rinse and to eliminate any traces of alkaline detergent, then
a third bath with a solution of de-ionized water with acid detergent designed to dissolve any potential pollutants such as salts of mineral materials or of metal oxides, then
a fourth bath with hard water designed to rinse and to eliminate any traces of acid detergent, then
a fifth and sixth bath of de-mineralized water for eliminating any mineral salts coming from the fourth hard water bath and well known as being responsible for traces in particular on glass substrates.

Each bath is regulated at a temperature of at least 30 to 40° C. and the detergency baths, previously referred to as one and two, can be equipped with an ultrasound source which facilitates the renewal of the active solution and enhances the efficiency of the cleaning process. The fifth bath can have an ultrasound source with a higher frequency with the objective of eliminating solid particles or fibers.

This example of a chain designed for substrate cleaning prior to deposition of one (or more) layer(s) of vitreous materials according to the invention and can be used for the cleaning of said layer(s) of vitreous materials before deposition of any additional layer or stack.

Advantageously again, the solution according to the invention can allow a layer of high index to be used on top of a standard glass substrate, of standard low index, which allows this alone to have an optical behavior similar to a high-index substrate+diffusing element assembly. Thus, the two fundamental elements for the increase of the extraction (index and diffusion) are combined in the (or the assembly of) layer(s) of vitreous material which is provided.

The present invention will be better understood from reading the detailed description hereinafter of non-limiting exemplary embodiments and from the appended figures.

Figure 1:
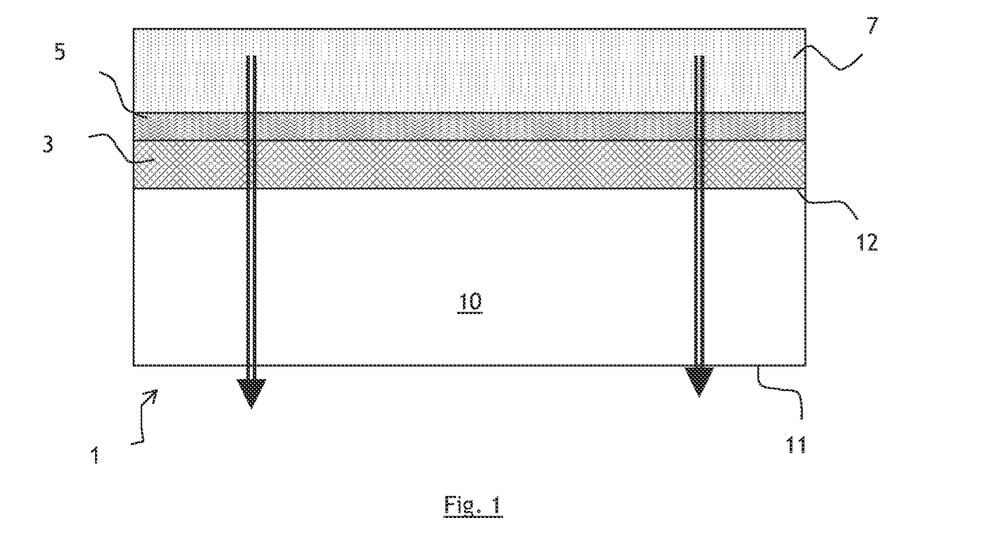
FIG. 1 illustrates a cross-sectional view of a substrate coated according to a first variant embodiment of the invention.
Figure 2:
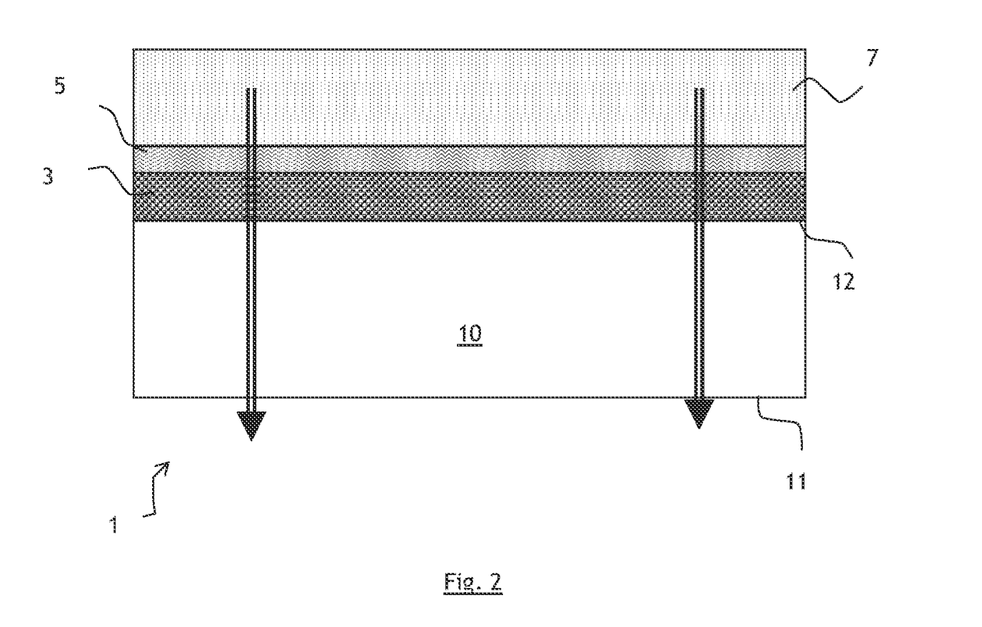
FIG. 2 illustrates a cross-sectional view of a substrate coated according to a second variant embodiment of the invention.

It is noted that, in these figures, the proportions between the various elements shown are not adhered to in order to facilitate the reading.

The substrate 10 according to the invention, as illustrated in FIGS. 1 and 2, is made of glass and comprises a first face 11 and a second face 12 opposing the first, together with a peripheral edging.

This substrate has a normal index in the sense that no particular measure has been taken for it to have a high index and which is in the range between 1.4 and 1.6. In the range considered here, this index is said to be "low".

The substrate 10 comprises, above its second face 12, an electrode layer 5 which is transparent and which comprises at least one electrically conducting layer, such as a layer of transparent conducting oxide, TCO, or one or more thin metal layers, as is taught for example by international patent application No. WO 2008/029060.

According to the invention, the substrate 10 comprises, between its second face 12 and the electrode layer 5, at least one layer of vitreous material 3 having an index in the range between 1.7 and 2.4, including these values, and more precisely here between 1.8 and 2.0, including these values. In the range in question here, this index is then said to be "high".

The vitreous material could comprise several layers, of different composition, as explained hereinafter.

The total thickness of vitreous material is preferably in the range between 1 µm and 100 µm, or between 2 µm and 80 µm, or even between 5 µm and 6.0 µm or else between 5 µm and 80 µm.

The vitreous material used for the layer of vitreous material comprises, when finally deposited on the substrate:
  on the one hand, between 40% and 60% by weight, including these values, of bismuth oxide $Bi_2O_3$ and, on the other hand, between 5% and 30% by weight, including these values, or even between 10 and 25% by weight, including these values, of zinc oxide ZnO; or,
  on the one hand, between 45% and 58% by weight, including these values, of bismuth oxide $Bi_2O_3$ and, on the other hand, between 5% and 30% by weight, including these values, or even between 10 and 25% by weight, including these values, of zinc oxide ZnO.

In FIGS. 1 and 2, an organic light-emitting system 7 has been illustrated on top of the electrode layer 5. The double arrows illustrate the emission of the light by this system.

In a first variant, illustrated in FIG. 1, said layer of vitreous material 3 is entirely made up of a single layer according to the invention, of high index.

In a second variant, illustrated in FIG. 2, as an alternative to the first variant, the layer of vitreous material 3 is composed of a single layer according to the invention, of high index, and furthermore comprises diffusing elements. These diffusing elements allow a capacity for diffusing light to be given to the layer of vitreous material. These diffusing elements have a characteristic dimension comparable with or greater than the wavelength of the light in the high index medium, which corresponds to dimensions in the range between a few hundreds of nanometers and a few microns.

These diffusing elements are, for example:
  air bubbles whose size and concentration within the layer are controlled, and/or
  particles of material of different index, such as for example particles containing titanium oxide which will have an index in the range 2.4 to 2.7 and/or
  crystals such as for example crystals of zircon or baddeleyite.

As previously indicated, it is perfectly possible to dispose, between the second face 12 and the electrode layer 5, several layers of vitreous material 3 each having a different index, a layer of vitreous material disposed in the direction of said second face 12 of the substrate 10 having a lower index than another layer of vitreous material disposed in the direction of said electrode layer 5.

Thus, it is possible to produce a gradient of index with several layers of vitreous material 3 each of which has a different composition since having a different index. Each layer of vitreous material 3 then preferably has an index in the range between 1.7 and 2.4.

It is thus possible to produce a vitreous coating with 2, 3, 4, or even more, layers of vitreous material 3. In order to make it chemically resistant, each layer of vitreous material 3 then comprises:
  on the one hand, between 40% and 60% by weight, including these values, of bismuth oxide $Bi_2O_3$ and, on the other hand, between 5% and 30% by weight, including these values, or even between 10 and 25% by weight, including these values, of zinc oxide ZnO; or,
  on the one hand, between 45% and 58% by weight, including these values, of bismuth oxide $Bi_2O_3$ and, on the other hand, between 5% and 30% by weight, including these values, or even between 10 and 25% by weight, including these values, of zinc oxide ZnO.

The composition of the (or each) layer of vitreous material 3 according to the invention is preferably, by weight:

TABLE 1

|  | Wide range | Preferred range |
| --- | --- | --- |
| $SiO_2$ | 0-10 | 0-5 |
| $Al_2O_3$ | 0-5 | 0-1 |
| $B_2O_3$ | 8-25 | 10-22 |
| CaO | 0-10 | 0-5 |
| BaO | 0-20 | 0-15 |
| $Li_2O$ | 0-5 | 0-3 |
| $Na_2O$ | 0-10 | 0-5 |
| $K_2O$ | 0-5 | 0-3 |
| $Bi_2O_3$ | 40-60 | 45-58 |
| $ZrO_2$ | 0-5 | 0-4 |
| SrO | 0-5 | 0-5 |
| $La_2O_3$ | 0-5 | 0-5 |
| Index $n_{(590\ nm)}$ | 1.7-2.4 | 1.8-2.0 |

The following two compositions (in % by weight) have been tested for a single layer of vitreous material 3 deposited onto the substrate:

TABLE 2

|  | Ex. 1 | Ex. 2 |
|---|---|---|
| $SiO_2$ | 12.1 | 3.8 |
| $Al_2O_3$ | 0.2 | 0.40 |
| $B_2O_3$ | 27.75 | 15.60 |
| CaO | 0 | 0 |
| BaO | 0 | 0 |
| $Li_2O$ | 0 | 0 |
| $Na_2O$ | 16.7 | 2.50 |
| $K_2O$ | 0 | 0.80 |
| ZnO | 41.5 | 17.40 |
| $Bi_2O_3$ | 0 | 54.60 |
| $ZrO_2$ | 0.1 | 4.40 |
| F | 1.6 | 0 |
| SrO | 0 | 0 |
| $La_2O_3$ | 0 | 0 |
| Index $n_{(590\ nm)}$ | 1.58 | 1.90 |

(taking measurement errors into account, the sum of the proportion of each constituent is equal to 100)

Each of these two examples has been subjected to a whole set of tests with acids, with bases, with commercial detergents and with solvents summarized in the following table:

TABLE 3

| SYSTEM | Temperature (° C.) | Time (mn) | Ex. 1 Aspect | Ex. 1 TL | Ex. 1 TD | Ex. 2 Aspect | Ex. 2 TL | Ex. 2 TD |
|---|---|---|---|---|---|---|---|---|
| REFERENCE |  |  |  | 77.0 | 70.0 |  | 59.3 | 59.3 |
| ACIDS |  |  |  |  |  |  |  |  |
| HCl pH 2 | 25 | 10 | N3 | 62.5 | 62.2 | N1 | 59.3 | 59.3 |
|  | 40 | 10 | N3 | 63.3 | 62.7 | N2 | 57.4 | 57.3 |
| HCl pH 4 | 25 | 10 | N1 | 77.5 | 70.7 | N1 | 59.4 | 59.3 |
|  | 40 | 10 | N1 | 77.1 | 70.4 | N1 | 59.6 | 59.6 |
| $H_2SO_4$ pH 2 | 25 | 10 | N3 | 61.2 | 61.7 | N2 | 56.7 | 56.6 |
|  | 40 | 10 | N3 | 64.8 | 64.0 | N2 | 59.9 | 59.7 |
| $H_2SO_4$ pH 4 | 25 | 10 | N1 | 77.0 | 70.4 | N1 | 59.3 | 59.3 |
|  | 40 | 10 | N2 | 77.0 | 70.6 | N1 | 59.5 | 59.3 |
| $H_3PO_4$ pH 2 | 25 | 10 | N2 | 66.5 | 65.5 | N2 | 59.2 | 59.1 |
|  | 40 | 10 | N3 | 61.3 | 61.3 | N1 | 59.6 | 59.4 |
| $H_3PO_4$ pH 4 | 25 | 10 | N1 | 77.2 | 70.4 | N1 | 59.5 | 59.4 |
|  | 40 | 10 | N2 | 77.0 | 71.0 | N1 | 59.6 | 59.3 |
| Merck Isishape 4S | 40 | 10 | N4 | X | X | N2 | 58.3 | 58.3 |
| BASES |  |  |  |  |  |  |  |  |
| NaOH pH 11 | 25 | 10 | N1 | 76.7 | 71.0 | N1 | 60.0 | 60.0 |
|  | 40 | 10 | N1 | 77.0 | 71.0 | N1 | 60.0 | 60.0 |
| NaOH pH 13 | 25 | 10 | N1 | 77.0 | 71.0 | N1 | 60.3 | 60.2 |
|  | 40 | 10 | N1 | 77.0 | 71.0 | N1 | 60.0 | 60.0 |
| COMMERCIAL DETERGENTS |  |  |  |  |  |  |  |  |
| Franklab Neutrax 1% pH~4 | 25 | 10 | N3 | 59.4 | 59.0 | N1 | 60.0 | 59.8 |
|  | 40 | 10 | N3 | 54.9 | 54.5 | N2 | 60.6 | 60.4 |
| Franklab TFD 66 4% pH~11 | 25 | 10 | N3 | 75.9 | 71.9 | N1 | 60.1 | 60.0 |
|  | 40 | 10 | N3 | 71.4 | 70.2 | N2 | 60.4 | 60.2 |
| RBS 2% | 25 | 10 | N2 | 76.3 | 70.3 | N1 | 59.2 | 59.0 |
|  | 40 | 10 | N2 | 76.1 | 70.3 | N1 | 59.7 | 59.6 |
| SOLVENTS |  |  |  |  |  |  |  |  |
| Ethanol 95% | 25 | 10 | N1 | 76.8 | 70.0 | N1 | 59.9 | 59.8 |
| Acetone | 25 | 10 | N1 | 77.0 | 70.0 | N1 | 59.5 | 59.4 |
| Isopropanol | 25 | 10 | N1 | 76.9 | 70.0 | N1 | 59.5 | 59.3 |

(RBS 2% is a base alkaline solution which is a mixture of ionic and non-ionic detergents+phosphates and polyphosphates with a concentration by volume of 2%, i.e. having a pH of around 11)

The substrates used for the tests (ex. 1 and 2) did not have a roughness suitable for the extraction of light; the face of the substrates onto which the layer of vitreous material has been deposited did not comprise diffusing means.

Each test is carried out by dipping a test piece of 4 cm in width and 7 cm in height and 2 mm in thickness into the bath specified in the left-hand column, each test piece being immersed up to 80% of its height in the bath, the test piece consisting only of the substrate 10 coated with the layer 3 of around 15 μm.

The chemical resistance of the two examples is appreciated visually according to the following scale of resistance:

Level N5: total loss of the layer
Level N4: severe degradation with local disappearance by dissolution
Level N3: significant degradation with change of color such as surface corrosion, bleaching or matting
Level N2: onset of etch reaction with appearance of the edge bounding the partial immersion and which corresponds to the liquid-air interface
Level N1: no visible reaction.

The changes in texture are also appreciated by variation in the values of the light transmission (TL) and of the diffuse transmission (TD). These values are measured with a device of the Hazemeter BYK type.

As is visible in table 3, the layers of the example 2 comprising bismuth accept 10 mn of immersion at 25° C. or 40° C. in the following baths:

acid at pH 4: hydrochloric acid, sulfuric acid, phosphoric acid.

commercial detergents: Franklab neutrax 1% pH 4, Franklab TFD 66 4% pH 11 and RBS 25 at 2%

These layers of the example 2 exhibit an enhanced resistance with respect to the layers of the example 1 when immersed for 10 mn in the following baths:
- acid at pH 2 and 25° C.: hydrochloric acid, phosphoric acid.
- commercial detergents at 25 and 40° C.: Franklab neutrax 1% pH 4, Franklab TFD 66 4% pH 11 and RBS at 2%.

These results showing good chemical resistance have been corroborated with tests in caustic soda at pH 11 and pH 13 and also with ultrasound tests.

The following two compositions (in % by weight) have been tested for a single layer of vitreous material 3 and these two compositions have given similar results to those of the example 2:

TABLE 4

|  | Ex. 3 | Ex. 4 |
|---|---|---|
| $SiO_2$ | 3.9 | 4.14 |
| $Al_2O_3$ | 0.4 | 0.6 |
| $B_2O_3$ | 16.4 | 10 |
| CaO | 0 | 0.04 |
| BaO | 0 | 0 |
| $Li_2O$ | 0 | <0.05 |
| $Na_2O$ | 2.6 | 2.15 |
| $K_2O$ | 0.8 | 0.03 |
| ZnO | 18.3 | 25.4 |
| $Bi_2O_3$ | 57.5 | 57.6 |
| $ZrO_2$ | 0 | 0 |
| SrO | 0 | 0 |
| $La_2O_3$ | 0 | 0 |
| Index $n_{(590\,nm)}$ | 1.83 | 1.91 |

(taking measurement errors into account, the sum of the proportion of each constituent is equal to 100)

It is furthermore possible for a face of the substrate or for each face of the substrate (said first face and/or said second face of the substrate) to be a diffusing surface and/or to be coated with at least one diffusing layer.

The layer of vitreous material 3 can be deposited from a frit, notably by silkscreen printing as explained hereinafter.

The fabrication of the layer of vitreous material 3 with enhanced chemical resistance can be carried out according to various industrial processes and preferably by silkscreen printing.

The Paste

The paste for silkscreen printing will be composed in proportions by weight of 10 to 50% for a silkscreen printing medium that will be used to carry the particles in order to pass through the application screen. This medium can be organic, composed of alcohols, of glycols, of esters, of terpineol which, when associated with fine mineral particles or cellulose ethers, give threshold fluid properties to the paste. This medium may also be mineral such as silicates of sodium, potassium or lithium or else colloidal silicas. The solid fraction is essentially composed of oxides of metals or minerals such as a glass frit with a high proportion of bismuth oxide. The bismuth oxide provides both the chemical resistance of the layer and its high-index nature. The index may be further enhanced by the association of a smaller quantity of submicron particles of the oxide, sulfate and carbonate type of elements such as titanium, barium, zinc, calcium, etc.

The slurrying of the constituents is carried out at a high speed in planetary mixers with disk dispersers. Low-speed systems may also be used as a complement whether this be prior to or following the high-speed operation. These low-speed systems are composed of a stirrer of the kneader or beater type or else of flasks comprising balls which are disposed for several hours on roller agitators operated at low speeds of a few revolutions per minute. The quality of the paste is appreciated by the absence of grains or of aggregate using an Egman gauge.

The Deposition

The deposition machines can be of reduced format of the electronics type (EKRA, DEK) or of industrial size (THIEME) as for flat glass. The screens will be composed of textile mesh (e.g.: polyester) or metal mesh. The masks can be composed of photoresist or of metal foils. The napping tools and the scraper will be made of polymer, carbon or metal. The deposited thicknesses are 10 to 100 μm on a glass substrate. The control of the thickness is first of all provided by the choice of the mesh size of the screen and its tension. The control of the thickness is also provided by the adjustments of the distance between the screen and the substrate together with the pressures and the displacement speeds applied to the scraper. The thicknesses will be verified by means of a laser optical test bench of the Rodenstock type between a coated or uncoated area. The deposits are dried at a temperature of around 100 to 150° C. in an infrared or UV radiation tunnel depending on the nature of the medium employed.

The deposition of the high-index layer can also be carried out by a means other than silkscreen printing: for example by roll coating, dip coating, knife-coating, sputtering, spin coating or else by vertical flow coating.

Changes in the powder-liquid ratios and additives are used to adapt the rheology of the composition to the chosen mode of deposition. Two different modes of deposition may be employed successively in order to form a stack of similar layers or with different compositions or with a gradient of one or more constituents.

The Curing

The ovens employed can be dynamic with transport on rollers like for the curing of automobile rear windows or preferably static with positioning on metal or vitro-ceramic plates for conservation of the flatness of the substrate. One preferred mode will be a curing with a slow temperature rise of 5 to 10° C./mn comprising plateaus of a few minutes to several tens of minutes. The curing time and the temperature situated between 550 and 670° C. allows the roughness to be minimized, the number and the size of bubbles to be controlled, and the growth of crystals to be limited.

The Resistance to Cleaning

The electronics industry commonly uses in cleanrooms substrates, comprising or not comprising layers, which have, in the first instance, to withstand cleaning procedures in baths that are manual or automated. These cleaning procedures must remove any trace of organic or mineral material, together with particles, from the substrates. The substrates therefore successively pass through stages in contact with base and acid detergent solutions with intermediate rinse steps. The cleaning power is enhanced by the presence of detergents, of ultrasound and a temperature often close to 40° C.

The composition rich in bismuth and containing zinc of the high-index vitreous layer gives it a high resistance in these aggressive environments such as the aforementioned baths. A vitreous layer of the zinc borate type (like that of the example 1), formed according to the same fabrication process, will be completely destroyed under the same cleaning conditions. The evaluation of the degradation of these diffusing layers is carried out by measurement of the modification of the values of light and diffuse transmission by means of a Hazemeter (Hazeguard BYK).

Two types of electrodes have been deposited onto two samples of the example 2:
- on the one hand, an electrode made of TCO based on ITO deposited hot (300° C.) with a fast temperature rise of the substrate (of around 50° C. per minute)
- and, on the other hand, an electrode made of TCC by cold sputtering according to the teaching of international patent application No. WO 2008/029060, and making each of the samples undergo the aforementioned required cleaning prior to the deposition of each electrode.

No degradation of the layer of vitreous material has been observed, either before, or after the deposition of the electrodes.

The chemical resistance of the layer of vitreous material according to the invention is enhanced by the fact that the layer of vitreous material has a low composition in water-soluble oxides. The water-soluble oxides are notably the alkaline oxides of the sodium and potassium type whose concentration will be lower than 15% by weight and preferably lower than 5%.

The present invention is described in the description hereinabove by way of example. It goes without saying that those skilled in the art are capable of implementing other variants of the invention without however straying from the scope of the patent such as defined by the claims.

The invention claimed is:

1. A glass substrate comprising a first face and a second face opposing the first face, said substrate comprising, above the second face, an electrode layer which comprises an electrically conducting layer, wherein said substrate comprises, between the second face and the electrode layer, a plurality of layers of vitreous material each having a different index, a layer of vitreous material disposed in the direction of said second face of the substrate having an index lower than that of another layer of vitreous material disposed in the direction of said electrode layer, wherein a first layer of vitreous material of the plurality of layers of vitreous material has an index in the range from 1.7 to 2.4 and comprises from 40% to 60% by weight of bismuth oxide $Bi_2O_3$ and, from 5% to 30% by weight, of ZnO and wherein a second layer of the vitreous material of the plurality of layers of vitreous material is different from the first layer of vitreous material and comprises from 5% to 30% by weight of ZnO.

2. The substrate as claimed in claim 1, wherein said first layer of vitreous material has a thickness in the range from 1 µm to 100 µm.

3. The substrate as claimed in claim 1, wherein each layer of said plurality of layers of vitreous material comprises from 40% to 60% by weight of bismuth oxide $Bi_2O_3$ and from 5% to 30% by weight of ZnO.

4. The substrate as claimed in claim 1, wherein the first layer of vitreous material comprises diffusing elements of index different from that of the layer of vitreous material and/or crystals.

5. The substrate as claimed in claim 1, wherein the first layer of vitreous material comprises, by weight:
from 0% to 10% of $SiO_2$,
from 0% to 5% of $Al_2O_3$,
from 8% to 25% of $B_2O_3$,
from 0% to 10% of CaO,
from 0% to 20% of BaO,
from 0% to 5% of $Li_2O$,
from 0% to 10% of $Na_2O$,
from 0% to 5% of $K_2O$,
from 0% to 5% of $ZrO_2$,
from 0% to 5% of SrO, and
from 0% to 5% of $La_2O_3$, wherein a maximum total percentage by weight of $SiO_2$, $Al_2O_3$, $B_2O_3$, CaO, BaO, $Li_2O$, $Na_2O$, $Na_2O$, $K_2O$, $ZrO_2$, SrO, and $La_2O_3$ in the first layer of vitreous material is 100%.

6. The substrate as claimed in claim 1, comprising diffusing elements with an index different from that of the first layer of vitreous material and/or of crystals.

7. The substrate as claimed in claim 1, wherein said first face of the substrate is a diffusing surface.

8. The substrate as claimed in claim 1, wherein said second face of the substrate is a diffusing surface and/or is coated with a diffusing layer.

9. The substrate as claimed in claim 1, comprising, above the electrode layer, an organic light-emitting system.

10. A device with an organic light-emitting diode emitting polychromatic light comprising a substrate as claimed in claim 1, and the electrode layer forming one of several electrodes of the device.

11. A support in a device with an organic light-emitting diode including a substrate as claimed in claim 1, the electrode layer forming one of several electrodes of the device.

12. A method of fabrication of a glass substrate comprising a first face and a second opposing face, as claimed in claim 1, said substrate comprising, above the second face, an electrode layer which comprises an electrically conducting layer, the method comprising depositing a plurality of layers of vitreous material each having a different index, a layer of vitreous material disposed in the direction of said second face of the substrate having an index lower than that of another layer of vitreous material disposed in the direction of said electrode layer, wherein a first layer of vitreous material of the plurality of layers of vitreous material having an index in the range from 1.7 to 2.4 above said second face of said substrate is deposited prior to depositing said electrode layer, said first layer of vitreous material comprising from 40% to 60% by weight of bismuth oxide $Bi_2O_3$ and from 5% to 30% by weight of ZnO, and a second layer of the vitreous material of the plurality of layers of vitreous material comprising from 5% to 30% by weight of ZnO is deposited prior to depositing said electrode layer, and said plurality of layers of vitreous material being deposited from a frit.

13. The substrate as claimed in claim 1, comprising from 45% to 58% by weight of bismuth oxide $Bi_2O_3$.

14. The substrate as claimed in claim 1, comprising from 10% to 25% by weight of ZnO.

15. The substrate as claimed in claim 2, wherein the thickness is in the range from 2 µm to 80 µm.

16. The substrate as claimed in claim 15, wherein the thickness is in the range from 5 µm to 60 µm.

17. The substrate as claimed in claim 4, wherein the diffusing elements include air bubbles and/or particles of material.

18. The substrate as claimed in claim 5, wherein the first layer of vitreous material comprises, by weight:
from 0% to 5% of $SiO_2$,
from 0% to 1% of $Al_2O_3$,
from 10% to 22% of $B_2O_3$,
from 0% 0% to 5% of CaO,
from 0% to 15% of BaO,
from 0% to 3% of $Li_2O$,
from 0% to 5% of $Na_2O$,
from 0% 0% to 3% of $K_2O$, and
from 0% 0% to 4% of $ZrO_2$.

19. The substrate as claimed in claim 1, wherein said first face of the substrate is coated with a diffusing layer.

20. The substrate as claimed in claim 1, wherein said first face of the substrate is coated with a diffusing layer and said first face of the substrate is a diffusing surface.

21. The method as claimed in claim 12, wherein said first layer of vitreous material is deposited by silkscreen printing or by sputtering.

* * * * *